United States Patent
Fornof et al.

(10) Patent No.: US 6,537,908 B2
(45) Date of Patent: Mar. 25, 2003

(54) METHOD FOR DUAL-DAMASCENCE PATTERNING OF LOW-K INTERCONNECTS USING SPIN-ON DISTRIBUTED HARDMASK

(75) Inventors: Ann Rhea-Helene Fornof, Toledo, OH (US); Stephen McConnell Gates, Ossining, NY (US); Jeffrey Curtis Hedrick, Montvale, NJ (US); Satyanarayana V. Nitta, Poughquag, NY (US); Sampath Purushothaman, Yorktown Heights, NY (US); Christy Sensenich Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,417

(22) Filed: Feb. 28, 2001

(65) Prior Publication Data
US 2002/0119654 A1 Aug. 29, 2002

(51) Int. Cl.[7] ........................................... H01L 21/4763
(52) U.S. Cl. ................. 438/638; 438/622; 438/623; 438/624; 438/634; 438/637; 438/672
(58) Field of Search .................. 438/618, 622, 438/624, 623, 625, 626, 627, 628, 629, 631, 633, 634, 636, 637, 638, 642, 643, 644, 645, 648, 650, 652, 653, 654, 672, 687, 780, 781

(56) References Cited

U.S. PATENT DOCUMENTS

| | | | | |
|---|---|---|---|---|
| 4,959,583 A | * | 9/1990 | Brewer et al. | 430/311 |
| 5,482,894 A | * | 1/1996 | Havemann | 438/623 |
| 5,529,954 A | * | 6/1996 | Iijima et al. | 438/653 |
| 5,635,423 A | * | 6/1997 | Huang et al. | 438/638 |
| 5,661,344 A | * | 8/1997 | Havemann et al. | 257/758 |
| 5,886,410 A | * | 3/1999 | Chiang et al. | 257/759 |
| 6,025,259 A | * | 2/2000 | Yu et al. | 438/618 |
| 6,071,809 A | | 6/2000 | Zhao | |
| 6,103,456 A | * | 8/2000 | Tobben et al. | 430/317 |
| 6,207,555 B1 | * | 3/2001 | Ross | 438/633 |
| 6,399,190 B1 | * | 6/2002 | Myers et al. | 428/335 |

OTHER PUBLICATIONS

Goldblatt, R.D., et al., "A High Performance 0.13 μm Copper BEOL Technology with Low-k Dielectric", Proceedings of 2000 IITC, IEEE, (2000).

Takao, Y., et al., "A 0.11 μm CMOS Technology with Copper and Very-low-k Interconnects for High-Performance System-On-a Chip Cores", IEEE, (2000) pp. 23.1.1–23.1.4.

Hasegawa, T., et al., "Copper Dual Damascene Interconnects with Low-K (Keff <3.0) Dielectrics Using FLARE™ and an Organo-Silicate Hard Mask", IEEE, (1999)pp. 26.4.1–26.4.4.

* cited by examiner

Primary Examiner—Amir Zarabian
Assistant Examiner—Maria Guerrero
(74) Attorney, Agent, or Firm—Scully, Scott, Murphy & Presser; Daniel P. Morris

(57) ABSTRACT

A cost effective and simple method of patterning interconnect structures is provided in which spun-on materials are used as the hard mask. The use of spun-on materials for the hard mask ensures that the process is carried out in a single tool and it permits the use of a single curing step which is not typically employed in patterning processes wherein CVD hard masks are employed. The effective dielectric constant of the resultant structure is not significantly increased since the use of spin coating allows for selection of a polish stop layer (formed on a surface of a low-k dielectric) that has substantially the same dielectric constant as the underlying dielectric. In the present invention, the hard mask employed includes at least two spun-on dielectric materials that have different etch rates.

27 Claims, 4 Drawing Sheets

METHOD FOR DUAL-DAMASCENCE PATTERNING OF LOW-K INTERCONNECTS USING SPIN-ON DISTRIBUTED HARDMASK

FIELD OF THE INVENTION

The present invention relates to interconnects for various semiconductor devices including high-speed microprocessors, application specific integrated circuits (ASICs) and other high-speed integrated circuits (ICs). More specifically, the present invention relates to a method to carry out a dual damascene process for copper, Cu, and low dielectric constant, i.e., low-k, interconnects based on a distributed hard mask. The inventive method provides a simple process which has fewer processing steps than conventional prior art patterning methods; therefore, a reduction in cost compared to prior art patterning methods can be obtained.

BACKGROUND OF THE INVENTION

Interconnect structures containing low-k dielectrics (on the order of about 3.5 or less), as the interlevel dielectric, and Cu, as the wiring or via levels, of the dual damascene-type are known in the prior art; See, for example, R. D. Goldblatt, et al., "A High Performance 0.13 μm Copper BEOL Technology with Low-K Dielectric", Proceedings of the International Technology Conference, IEEE Electron Devices Society, Jun. 5–7, 2000 pgs 261–263. Commonly, prior art methods to fabricate Cu interconnect structures of the dual damascene-type in a polymeric low-k dielectric use hard mask layers that are deposited in a vacuum-based plasma-enhanced chemical vapor deposition (CVD) tool or by other deposition processes such as high density plasma, etc. The polymeric low-k dielectric, on the other hand, is formed by means of a spinn on coating tool.

A typical prior art process for forming a dual damascene-type Cu interconnect structure is shown in FIGS 1A–1E. Specifically, FIG. 1A shows an initial structure which includes interlevel dielectric 10 having hard mask layer 12 comprising polish stop layer 14 and patterning layer 16 formed thereon. As is illustrated, polish stop layer 14 is formed on the surface of the interlevel dielectric and patterning layer 16 is formed on the polish stop layer. In these drawings, interlevel dielectric is a low-k dielectric material having a dielectric constant of from about 3.5 or less which is formed on a substrate (not shown) by means of spin coating. Polish stop layer 14 and patterning layer 16 are formed on the interlevel dielectric by using plasma-enhanced CVD. It is noted that the polish stop layer and patterning layer of the hard mask are chosen to have different etching rates which allows for the formation of vias and/or lines in the interlevel dielectric.

Following the formation of the hard mask on the surface of the interlevel dielectric, a photoresist (not shown) is formed on an exposed surface of the patterning layer and a pattern is formed in the resist by conventional lithography including resist exposure and development. The pattern is then transferred to the patterning layer, stopping on the polish stop layer utilizing a conventional etching process such as reactive-ion etching (RIE). The photoresist used in opening the patterning layer is then removed by conventional means providing the structure shown in FIG. 1B.

The polish stop layer is then opened by applying a second photoresist to the hard mask (not shown in the drawings) and subjecting the same to lithography and etching. The second resist is stripped providing the structure shown in FIG. 1C. Note that this step provides opening 18 in the polish stop layer which exposes a surface of the interlevel dielectric.

The interlevel dielectric is then subjected to an etching process so as to remove exposed portions of the interlevel dielectric such as shown in FIG. 1D. Cu or another conductive metal 20 is then deposited in the etched areas of the interlevel dielectric and thereafter the structure is subjected to a conventional planarization process to form the structure shown in FIG. 1E. Note that the final structure does not include the patterning layer, but does include the polish stop layer.

Not only are PECVD tools costly to purchase and manufacture, but also the use of both a PECVD tool and a spin-on coating tool in fabricating the Cu interconnect structure leads to increased raw processing time (RPT) due to the required transfer of wafers between tools. Also, current polish stop layers have a relative dielectric constant, k, of about 4 to 7, which is significantly greater than that of the low-k dielectric used in forming the interlevel of the interconnect structure. Since the effective dielectric constant of the device is dependent on the summation of all the dielectrics present in the structure, the presence of a polish stop layer having a high-dielectric constant would lead to an increased effective dielectric constant and loss of circuit performance.

In view of the drawbacks mentioned in the prior art methods of fabricating Cu interconnects of the dual-damascene-type, there is a continued need for developing a new and improved method of fabricating a Cu dual damascene-type structure which does not significantly increase the effective dielectric constant of the device. Moreover, a method is needed that is simple to use, yet reduces the number of processing steps and therefore cost of the overall process. Such a method would represent a significant improvement over prior art methods of fabricating a Cu interconnect structure of the dual-damascene-type.

SUMMARY OF THE INVENTION

One object of the present invention is to provide a method of fabricating a Cu interconnect structure that includes a low-k dielectric that includes one tool for manufacturing both the low-k dielectric and the hard mask, i.e., polish stop and patterning layers.

Another object of the present invention is to provide a method of fabricating a Cu interconnect structure containing a low-k dielectric interlevel wherein the effective dielectric constant of the resultant device is not significantly increased.

A further object of the present invention is to provide a method of fabricating a Cu interconnect structure containing a low-k dielectric in which both the hard mask and the low-k dielectric are cured in a single step, rather than multiple curing steps as is required by prior art patterning methods.

An additional object of the present invention is to provide a method of fabricating a Cu interconnect structure containing a low-dielectric wherein PECVD is not employed to deposit the hard mask, i.e., patterning and polish stop layers.

These and other objects and advantages are achieved in the present invention by utilizing a method wherein a spin-on coating tool is employed in forming both the low-k dielectric material as well as the hard mask, i.e., polish stop and patterning layers, of a dual damascene-type interconnect structure. Since both layers of the hard mask are formed by spin-on coating, the use of conventional PECVD tools is eliminated; therefore reducing the cost of the overall manufacturing process.

Specifically, the patterning method of the present invention comprises the steps of:

(a) spin-on coating a dielectric material having a dielectric constant of about 3.5 or less on the surface of a substrate;

b) forming a hard mask comprising at least a polish stop layer and a patterning layer on a surface of said dielectric material, wherein said polish stop layer and said patterning layer have different etching rates and are both formed by spin-on coating and said polish stop layer has a dielectric constant that is compatible with said dielectric material and has an etch selectivity to said dielectric material, and said patterning layer has an etch selectivity to said polish stop layer;

(c) curing said hard mask and said dielectric material;

(d) forming an opening in said hard mask so as to expose a portion of said dielectric material;

(e) etching said exposed portion of said dielectric material so as to form a trench in said dielectric material;

(f) filling said trench with at least a conductive metal; and (g) planarizing said conductive metal stopping on the uppermost surface of said polish stop layer.

DETAILED DESCRIPTION OF THE INVENTION

Figure 1A:
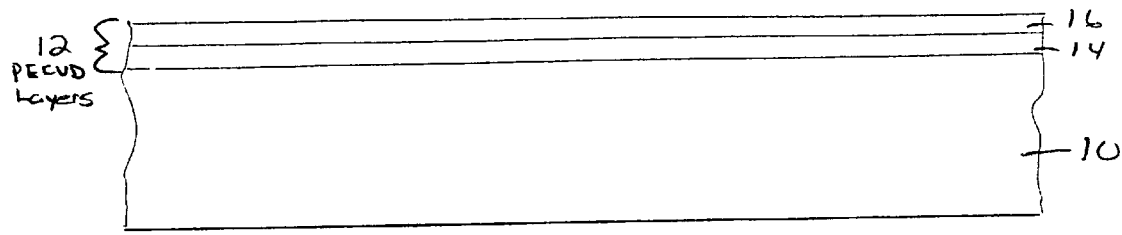
FIGS 1A–1E are cross-sectional views of a prior art patterning process wherein the hard mask includes a polish stop layer and a patterning layer that are both formed by PECVD.
Figure 1B:
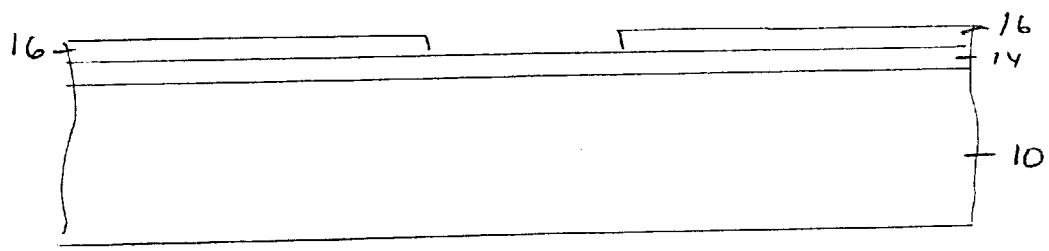
Figure 1C:
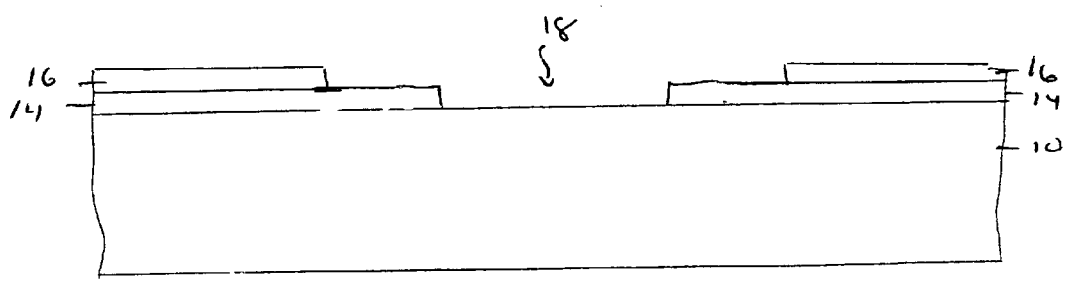
Figure 1D:
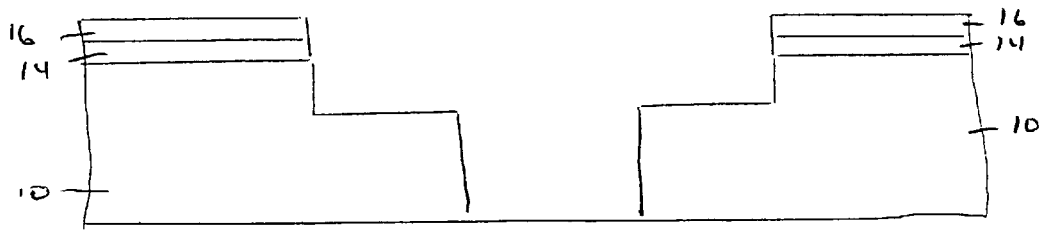
Figure 1E:
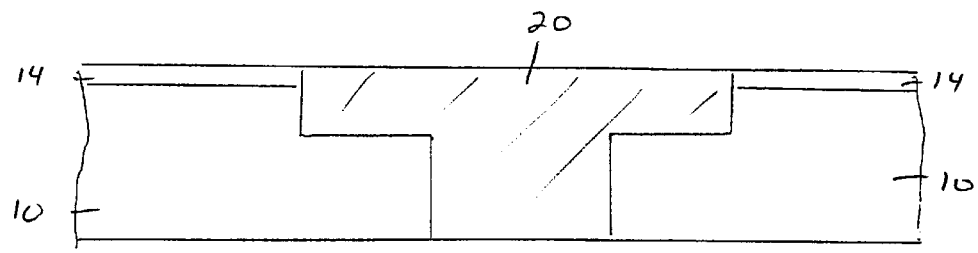

The present invention, which provides a cost efficient means for patterning low-k dielectrics without significantly increasing the effective dielectric-k of the dielectric, will now be described in more detail by referring to the drawings that accompany the present application. It is noted that in the accompanying drawings like and/or corresponding elements are referred to by like reference numerals.

Figure 2A:
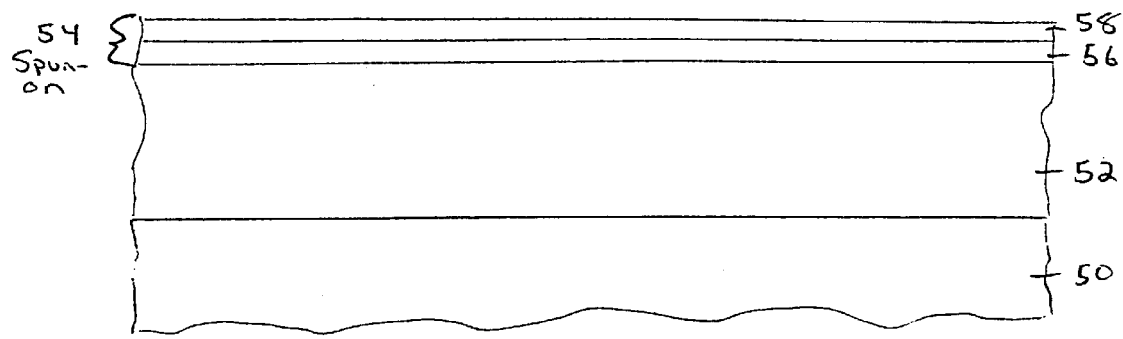
FIGS. 2A–2F are cross-sectional views of the inventive patterning method wherein the hard mask includes a polish stop layer and a patterning layer that are both formed by spin-on coating.

Reference is first made to FIG. 2A which illustrates an initial structure that is employed in the present invention. Specifically, the initial structure shown in FIG. 2A comprises substrate 50 having low-k dielectric material 52 formed on a surface thereof The structure also includes hard mask 54 which comprises spun-on polish stop layer 56 and spun-on patterning layer 58. It should be noted that although the drawings depict the hard mask as containing two layers, the hard mask is not limited to just two layers. Instead, the hard mask employed in the present invention may include more than two different spun-on materials.

Substrate 50 of the structure shown in FIG. 2A includes various materials that are typically present in interconnect structure. For example, substrate 50 may be a dielectric material, a buried barrier layer, a metal wiring layer, a semiconductor wafer or another like substrate typically present in interconnect structures.

An optional adhesion promoter such as AP 400 sold by Dow Chemical Company, or any other adhesion promoter including alkoxysilanes such as 3-aminopropyltriethoxysilane may be formed on the surface of substrate 50 prior to forming the low-k dielectric material thereon. When an adhesion promoter is employed, the adhesion promoter is formed on substrate 50 utilizing conventional spin-on coating processes well known to those skilled in the art. Following the formation of the optional adhesion promoter, the adhesion promoter is subjected to a hot plate bake process that is typically carried out at a temperature of from about 90° to about 500° C. for a time period of from about 10 to about 60 seconds. More preferably, this hot plate bake step is carried out at a temperature of from about 250° to about 400° C. for a time period of from about 60 to about 300 seconds. It is noted that other temperatures and times besides those reported herein may be employed for this hot bake step so long as the conditions chosen are capable of driving-off any residual solvent from the spun-on adhesion promoter. In some cases, this hot plate bake step may cause partial curing of the adhesion promoter.

The low-k dielectric material employed in the present invention has a dielectric constant of from about 1.1 to about 3.5, with a dielectric constant of from about 1.4 to about 3.0 being more preferred. Typically, the low-k dielectric material is an organic containing polymeric material which comprises C, O and H. Examples of organic low-k dielectrics that can be employed in the present invention include, but are not limited to: aromatic thermosetting polymeric resins, for example, resins sold by Dow Chemical Company under the tradename SiLK®, Honeywell under the tradename Flare®, and similar resins from other suppliers, and other organic dielectrics. The low-k dielectric may be a porous dielectric material or it may be non-porous. The low-dielectric constant material may be an interlevel dielectric layer or an intralayer dielectric of an interconnect structure.

Notwithstanding which type of low-k dielectric is employed in the present invention, the low-k dielectric is formed on an exposed surface of substrate 50 utilizing conventional spin-on coating processes that are well known to those skilled in the art. Following the formation of the low-k dielectric on the surface of substrate 50, the low-k dielectric is subjected to a hot plate bake process that is typically carried out using the same conditions as mentioned above for the adhesion promoter. It is noted that other temperatures and times besides those reported herein may be employed for this hot plate bake step so long as the conditions chosen are capable of driving-off any residual solvent from the low-k dielectric, and render the low-dielectric insoluble during the application of a subsequent layer.

As stated above, hard mask 54 comprises at least polish stop layer 56 and patterning layer 58. Other additional spun-on material layers may also be present, thus the invention is only limited by the fact that at least the two aforementioned layers need to be present in the hard mask and that the various layers are all formed by spin-on coating. The hard mask is formed utilizing conventional spin-coating processes and following the formation of each layer, separate hot plate bake processes are performed. The conditions for these hot plate bake processes may vary and are not limited so long as they are sufficient to drive-off residual solvent and render the layers insoluble. It is noted that the hot plate bake conditions mentioned above for the adhesion promoter can be used in this hot plate bake step as well.

In accordance with the present invention, the polish stop layer of the hard mask is composed of any material that has a dielectric constant that is significantly low so that it does not significantly increase the dielectric constant of the low-k dielectric material. Moreover, the polish stop layer has a good etch selectivity to the dielectric material and a low polish rate in a subsequent CMP process. Thus the polish stop layer employed in the present invention is a material that serves an etch stop layer, while not significantly increasing the effective dielectric constant of the device. Examples of suitable polish stop layers that may be employed in the present invention include: inorganic-containing dielectrics which have a dielectric constant of from about 1.1 to about 5.5, more preferably from about 2.0 to about 3.2, and comprise Si, O and H, and optionally C. In some embodiments, C is a required element. Examples of some preferred polish stop layer that can be employed herein include, but are not limited to: the silsesquioxane HOSP (Si-containing inorganic dielectric sold by Honeywell), methylsilsesquioxane (MSQ), hydrido silsesquioxane (HSQ), tetraethylorthosilicate (TEOS), MSQ-HSQ copolymers, organosilanes, and any other Si-containing material.

The thickness of the polish stop layer of hard mask 54 may vary and is not critical to the present invention. Typically, however, polish stop layer 56 has a thickness of from about 100 to about 1000 Å. The thickness of this layer is typically reduced during subsequent planarization or polishing process.

The second required layer of the inventive hard mask is patterning layer 58. The patterning layer is composed of any material which has an etch selectivity for the underlying polish stop layer. Typically, in the present invention, patterning layer 58 has an etch selectivity of about 15:1 compared to the underlying polish stop layer. The patterning layer employed in the present invention may include inorganic or organic spun-on dielectric materials which provide the above mentioned etch selectivity. Also, a high polish rate in the metal CMP process is preferred. An example of a patterning layer that may be employed in the present invention is SiLK®, Flare® or any of the other above-mentioned organic dielectrics.

The thickness of the patterning layer may vary and is not critical to the present invention. Typically, however, the patterning layer has a thickness of from about 100 to about 3000 Å.

Following formation of the hard mask, the hard mask, i.e., polish stop and patterning layers, as well as the underlying dielectric material are subjected to a single curing step which is carried out using conventional conditions well known to those skilled in the art. The curing step may include a hot plate bake step or furnace heating. Although the conditions for curing may vary, typically, hot plate baking is carried out at temperature of from about 250° to about 500° C. for a time period of from about 30 to about 500 seconds, while the furnace heating step is carried out at a temperature of from about 200° to about 500° C. for a time period of from about 15 minutes to about 3.0 hours.

Figure 2B:
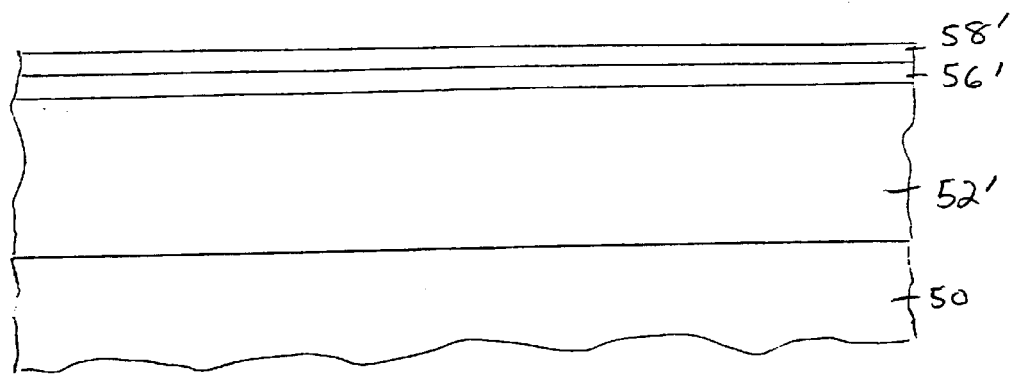
Figure 2C:
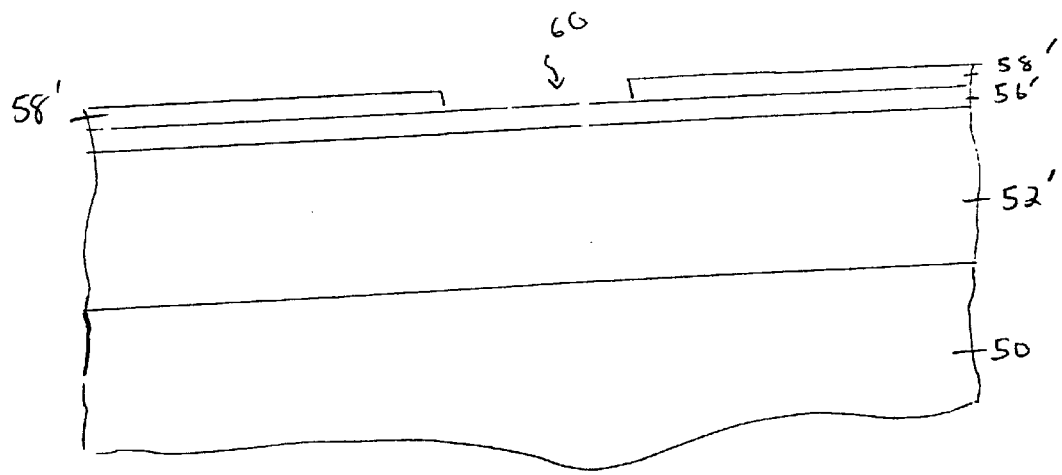

The cured layers are shown in FIG. 2B are labeled as 52' (cured dielectric), 56' (cured polish stop layer) and 58' (cured patterning layer). Following curing of the dielectric and the hard mask, the structure shown in FIG. 2B is then subjected to a first lithography and etching process which forms opening 60 in cured patterning layer 58'; See FIG. 2C. Specifically, the structure shown in FIG. 2C is formed as follows: First, a photoresist (not shown in the drawings) used for patterning the patterning layer is formed on the cured patterning layer using conventional deposition processes well known to those skilled in the art. The photoresist is then exposed to a pattern of radiation and thereafter the pattern is developed in the photoresist using conventional resist developers.

After developing the resist pattern, opening 60 is formed in the hard mask so as to expose a portion of the underlying polish stop layer. Specifically, the opening is formed by utilizing a conventional dry etching process including, but not limited to: reactive-ion etching (RIE), plasma etching and ion beam etching. Of these various dry etching processes, it is preferred to use RIE that includes fluorine-based chemistries. After this etching step, the patterned photoresist is stripped from the structure utilizing conventional stripping processes well known to those skilled in the art. The resultant structure obtained from the first lithography and etching step is shown in FIG. 2C.

Figure 2D:
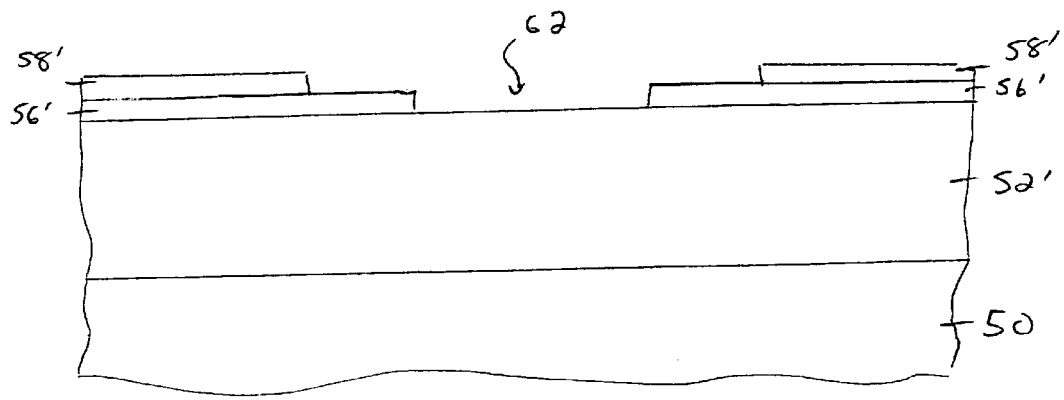

After stripping the photoresist from the structure, a new photoresist (not shown) is applied to the structure shown in FIG. 2C. The new photoresist is then subjected to lithography and etching so as to provide second opening 62 in the structure which exposes a surface of cured dielectric 52'. The second etching step includes one of the aforementioned dry etching processes. Of these various dry etching processes, it is preferred to use RIE that includes fluorine-based chemistries. Following the second etch which exposes the cured dielectric, the second photoresist is stripped from the structure utilizing conventional stripping process providing a structure such as shown in FIG. 2D.

Figure 2E:
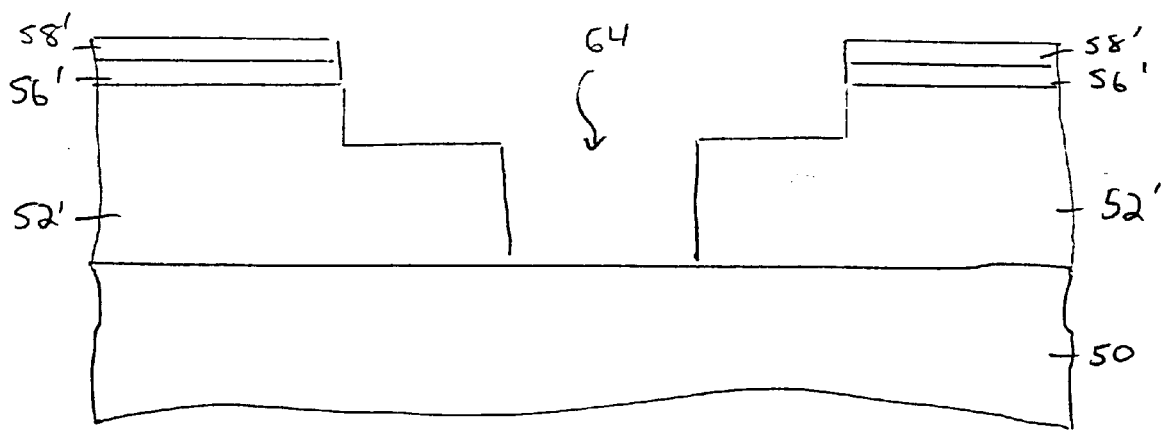

FIG. 2E shows the structure after the pattern formed in the hard mask is transferred to the dielectric. Specifically, the pattern transfer which forms trench 64 in the dielectric is carried out using a dry etching process that includes oxygen or reducing chemistry. In accordance with the present invention, trench 64 may be a via, line or both.

Figure 2F:
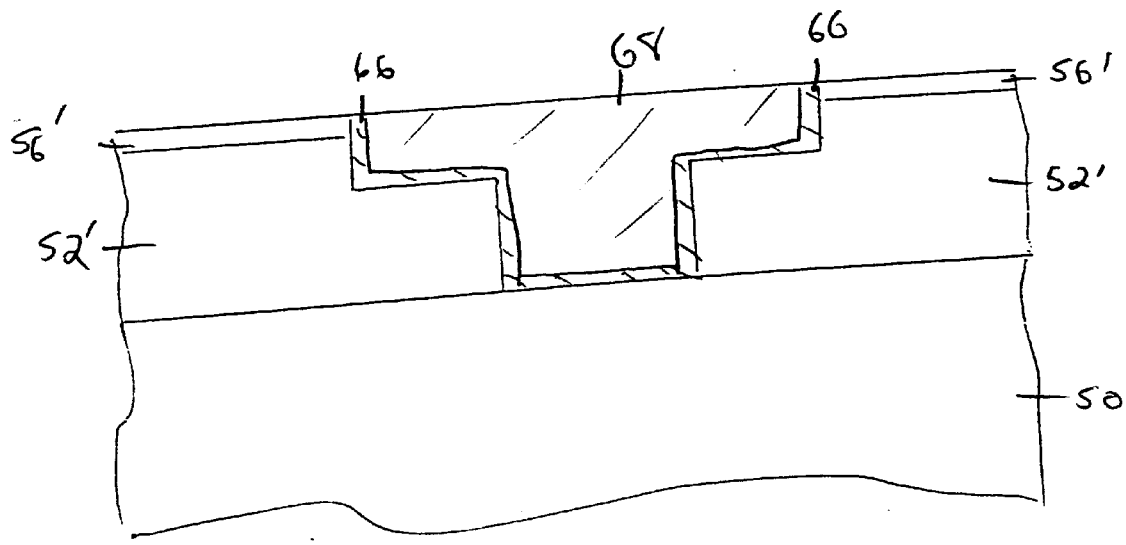

Following the pattern transfer to the dielectric material, the trench is then filled with at least conductive metal 68 and planarized so as to provide the structure shown in FIG. 2F. An optional, but preferable liner material 66 may be formed in the trench prior to filling with the conductive metal. The term "conductive metal" is used herein to denote a metal selected from the group consisting of aluminum (Al), copper (Cu), tungsten (W), silver (Ag) and other like metals which are typically used in interconnect structures. Alloys of these conductive metals such as Al—Cu are also contemplated herein. A preferred metal used in the present invention is copper. The metal is formed in the trench utilizing a conventional deposition process such as chemical vapor deposition (CVD), plasma-assisted CVD, plating, sputtering, chemical solution deposition and other like deposition processes.

The optional liner material employed in the present invention includes any material which would prevent the diffusion of the conductive metal into the dielectric layer. Some examples of such liners include, but are not limited to: TiN, TaN, Ti, Ta, W, WN, Cr, Nb and other like materials. The liner material may be formed in the trench utilizing conventional deposition processes well known to those skilled in the art, including: CVD, plasma-assisted CVD, sputtering, plating and chemical solution deposition.

After filling the trench with a conductive metal and optional liner, the structure is subjected to a conventional planarization process such as chemical-mechanical polishing (CMP) which removes any conductive metal and optional liner above the polishing stop layer. Note that the planarization step also removes the patterning layer of the hard mask, but not the polish stop layer from the structure. Instead, the polish stop layer remains on the surface of the structure. Because of this reason, it is essential to choose a polish stop layer that has a dielectric constant that is relatively-low so as to not increase the effective dielectric constant of the interconnect structure. Additionally, the polish stop layer should have a low CMP polish rate.

Following the processing steps of the present invention additional via and wiring levels may be formed over the structure shown in FIG. 2F by repeating the processing steps of the present invention. Thus, the inventive method can be used to prepare interconnect structures that include one or more wiring and via levels present therein.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a patterned interconnect structure comprising the steps of:
   (a) spin-on coating a dielectric material having a dielectric constant of about 3.5 or less on the surface of a substrate;
   (b) forming a hard mask comprising at least a polish stop layer and a patterning layer on a surface of said dielectric material, wherein said polish stop layer and said patterning layer have different etching rates and are both formed by spin-on coating, said polish stop layer comprises Si, O and H as essentially elements and has a dielectric constant that is compatible with said dielectric material and has an etch selectivity to said die material, and said patterning layer has an etch selectivity to said polish stop layer;
   (c) curing, in a single step, said hard mask including said polish stop layer and said patterning layer as well as said dielectric material to form a cured dielectric material and a cured hard mask including a cured polish stop layer and a cured patterning layer;
   (d) forming an opening in said cured hard mask so as to expose a portion of said cured dielectric material;
   (e) etching said exposed portion of said cured dielectric material so as to form a trench in said cured dielectric material;
   (f) filling said trench with at least a conductive metal; and
   (g) planarizing said conductive metal stopping on an uppermost surface of said cured polish stop layer.

2. The method of claim 1 wherein said dielectric material has a dielectric constant of from about 1.4 to about 3.0.

3. The method of claim 1 wherein said substrate is a dielectric material, a buried barrier layer, a metal wiring layer or a semiconductor wafer.

4. The method of claim 1 wherein polish stop layer is an inorganic-containing dielectric.

5. The method of claim 1 wherein said polish stop layer further comprises C as an essential element.

6. The method of claim 1 wherein said polish stop layer has a low chemical mechanical polishing (CMP) rate in a metal CMP process.

7. The method of claim 1 wherein said patterning layer is composed of an organic-containing dielectric.

8. The method of claim 1 wherein said polish stop layer and said patterning layer are subjected to separate hot plate bake processes after formation of each layer.

9. The method of claim 1 wherein said curing step is carried out by a hot plate bake process.

10. The method of claim 1 wherein said curing step is carried out by furnace heating.

11. The method of claim 1 wherein step (d) includes two separate and distinct lithography and etching processes.

12. The method of claim 1 wherein step (e) includes etching in oxygen or a reducing gas atmosphere.

13. The method of claim 1 wherein said trench is a via opening, a line opening or both.

14. The method of claim 1 wherein step (g) includes chemical-mechanical polishing.

15. The method of claim 1 wherein said dielectric material is an organic-containing polymeric material.

16. The method of claim 1 wherein an adhesion promoter is formed on said substrate prior to step (a).

17. The method of claim 1 wherein said spun-on dielectric is hot plate baked prior to step (b).

18. The method of claim 1 wherein a liner material is formed in said trench prior to filling.

19. The method of claim 1 wherein said conductive metal is composed of Al, Cu, W, Ag or alloys thereof.

20. The method of claim 15 wherein said organic-containing polymeric material is porous.

21. The method of claim 15 wherein said organic-containing polymeric material comprises C, O and H.

22. The method of claim 15 wherein said organic-containing polymeric material is an aromatic thermosetting polymeric resin.

23. The method of claim 16 wherein said adhesion promoter comprises an alkoxysilane.

24. The method of claim 16 wherein said adhesion promoter is formed by spin-on coating.

25. The method of claim 17 wherein said hot plate baking is carried out at temperature of from about 90° to about 500° C. for a time period of from about 10 to about 600 seconds.

26. The method of claim 18 wherein said liner is composed of TaN, TiN, Ta, Ti, W, WN, Cr, Nb or mixtures thereof.

27. The method of claim 19 wherein said conductive metal is Cu.

* * * * *

UNITED STATES PATENT AND TRADEMARK OFFICE
CERTIFICATE OF CORRECTION

PATENT NO. : 6,537,908 B2
DATED : March 25, 2003
INVENTOR(S) : Ann R. Fornof et al.

It is certified that error appears in the above-identified patent and that said Letters Patent is hereby corrected as shown below:

<u>Title page,</u>
Item [56], U.S. PATENT DOCUMENTS, "9/1990" should read -- 8/1990 --

Signed and Sealed this

Twenty-third Day of September, 2003

JAMES E. ROGAN
*Director of the United States Patent and Trademark Office*